United States Patent
Yang et al.

(10) Patent No.: US 12,196,812 B2
(45) Date of Patent: Jan. 14, 2025

(54) MANAGEMENT DEVICE AND POWER SUPPLY SYSTEM FOR VEHICLES

(71) Applicant: Panasonic Intellectual Property Management Co., Ltd., Osaka (JP)

(72) Inventors: Changhui Yang, Osaka (JP); Takashi Matsuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 606 days.

(21) Appl. No.: 17/622,099

(22) PCT Filed: Jun. 15, 2020

(86) PCT No.: PCT/JP2020/023321
§ 371 (c)(1),
(2) Date: Dec. 22, 2021

(87) PCT Pub. No.: WO2021/005969
PCT Pub. Date: Jan. 14, 2021

(65) Prior Publication Data
US 2022/0381835 A1 Dec. 1, 2022

(30) Foreign Application Priority Data
Jul. 9, 2019 (JP) .................................. 2019-127690

(51) Int. Cl.
*G01R 31/382* (2019.01)
*G01R 31/392* (2019.01)
(Continued)

(52) U.S. Cl.
CPC .......... *G01R 31/382* (2019.01); *G01R 31/392* (2019.01); *H01M 10/486* (2013.01); *H01M 2010/4271* (2013.01); *H01M 2220/20* (2013.01)

(58) Field of Classification Search
None
See application file for complete search history.

(56) References Cited

U.S. PATENT DOCUMENTS 6,204,634 B1 * 3/2001 Zimmerman ......... H02J 7/0069
320/128
2016/0264017 A1 9/2016 Komiyama
(Continued)

FOREIGN PATENT DOCUMENTS

| JP | 2016-163532 A | 9/2016 |
| JP | 2016-167368 | 9/2016 |

(Continued)

OTHER PUBLICATIONS

International Search Report of PCT application No. PCT/JP2020/023321 dated Aug. 18, 2020.
(Continued)

*Primary Examiner* — Roy Y Yi
(74) *Attorney, Agent, or Firm* — Rimon P.C.

(57) ABSTRACT

When a use range of an SOC (State Of Charge) of a secondary battery is expanded, the use range of the SOC is expanded by increasing an upper limit value or decreasing a lower limit value of the use range of the SOC. The increasing the upper limit value or decreasing the lower limit value of the use range of the SOC is determined to a side causing a smaller increase in a degradation rate of the secondary battery, based on at least one of a cycle degradation characteristic that defines a cycle degradation rate in accordance with the use range of the SOC and a current rate of the secondary battery and a storage degradation characteristic that defines a storage degradation rate in accordance with the SOC and a temperature of the secondary battery, and a typical use condition of the secondary battery based on a use history of the secondary battery.

5 Claims, 5 Drawing Sheets

(51) Int. Cl.
  *H01M 10/42* (2006.01)
  *H01M 10/48* (2006.01)

(56) References Cited

U.S. PATENT DOCUMENTS

2018/0050601 A1   2/2018   Katanoda
2018/0358663 A1   12/2018   Yonemoto et al.

FOREIGN PATENT DOCUMENTS

JP       2018-029430        2/2018
WO    WO-2015098012 A1 *   7/2015   ............... B60K 6/48

OTHER PUBLICATIONS

The Extended European Search Report dated Jul. 25, 2022 for the related European Patent Application No. EP20836490.1.

* cited by examiner (a)

(b)

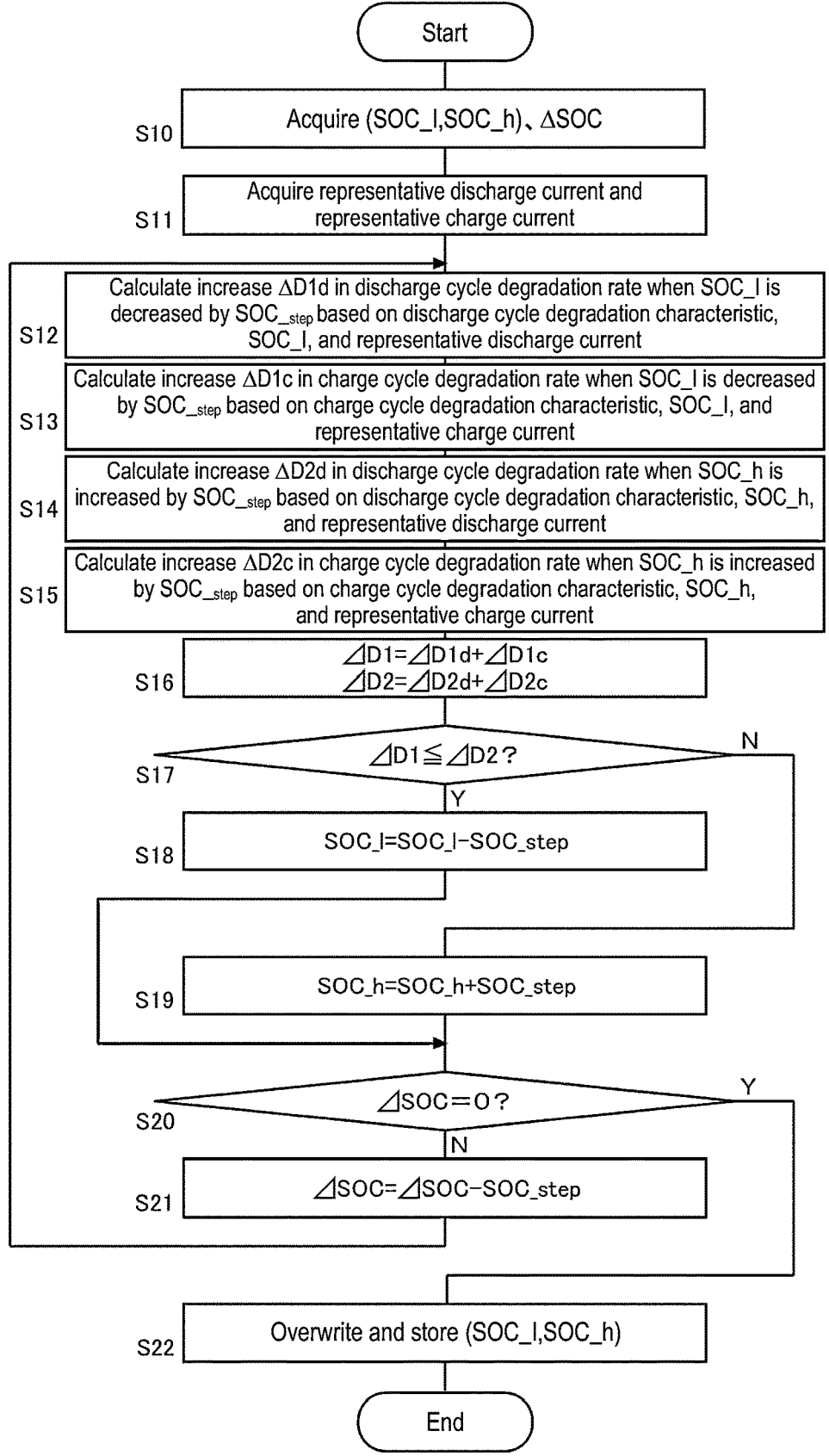

MANAGEMENT DEVICE AND POWER SUPPLY SYSTEM FOR VEHICLES

CROSS-REFERENCE TO RELATED APPLICATIONS

This application is a U.S. national stage application of the PCT International Application No. PCT/JP2020/023321 filed on Jun. 15, 2020, which claims the benefit of foreign priority of Japanese patent application No. 2019-127690 filed on Jul. 9, 2019, the contents all of which are incorporated herein by reference.

TECHNICAL FIELD

The present invention relates to a management device that manages a secondary battery and a power supply system for vehicles.

BACKGROUND ART

In recent years, hybrid vehicles (HVs), plug-in hybrid vehicles (PHVs), and electric vehicles (EVs) have become widespread. These electric vehicles are each equipped with a secondary battery as a key device.

In a secondary battery mounted on an electric vehicle, a use range of a state of charge (SOC) is often limited (for example, limited to 20% to 80%) in order to suppress degradation. When the full charge capacity of the secondary battery decreases due to degradation of the secondary battery, the battery capacity may become insufficient to travel a necessary distance. In that case, it is necessary to review the use range of the SOC and expand the use range of the SOC. However, the expansion of the use range of the SOC may accelerate the progress rate of degradation.

On the other hand, a method has been proposed in which the degradation degree of the secondary battery is estimated, and the upper limit value or the lower limit value of the use range of the SOC is adjusted using the degradation degree of the secondary battery as a correction factor. For example, a method has been proposed in which a degradation degree of a secondary battery is estimated from a use history of the secondary battery, and when the estimated degradation degree is less than a preset degradation degree, an upper limit value of a use range of an SOC is increased (see, for example, PTL 1). In addition, a method has been proposed in which a shift loss of a secondary battery is estimated from a use history of the secondary battery, a change amount of a lower limit voltage of a positive electrode is calculated from the estimated shift loss, and a lower limit value of a use range of an SOC is reduced in accordance with the calculated change amount of the lower limit voltage of the positive electrode (see, for example, PTL 2).

CITATION LIST

Patent Literature

PTL 1: Unexamined Japanese Patent Publication No. 2018-29430
PTL 2: Unexamined Japanese Patent Publication No. 2016-167368

SUMMARY OF THE INVENTION

However, in any of the methods, the traveling performance is prioritized, and the control is insufficient from the viewpoint of suppressing the degradation of the secondary battery.

The present disclosure has been made in view of such a situation, and an object thereof is to provide a technique for optimally suppressing degradation of a secondary battery while ensuring a necessary capacity.

In order to solve the above problem, a management device according to an aspect of the present disclosure includes: a measurement unit that measures at least one of a current and a temperature of a secondary battery; a holding unit that accumulates a value measured by the measurement unit as a use history of the secondary battery; and a controller that, when expanding a use range of an SOC of the secondary battery, increases an upper limit value or decreases a lower limit value of the use range of the SOC to expand the use range of the SOC. The controller selects one of increase of the upper limit value and decrease of the lower limit value, the one of the increase of the upper limit value and the decrease of the lower limit value causing a smaller increase in a degradation rate of the secondary battery than the other of the increase of the upper limit value and the decrease of the lower limit value, the selecting being made based on a typical use condition of the secondary battery based on a use history of the secondary batter, and at least one of a cycle degradation characteristic that defines a cycle degradation rate in accordance with a use range of the SOC and a current rate of the secondary battery and a storage degradation characteristic that defines a storage degradation rate in accordance with an SOC and a temperature of the secondary battery.

An arbitrary combination of the above constituents and a conversion of the expressions of the present invention among methods, apparatuses, systems, and the like are also effective as an aspect of the present invention.

According to the present disclosure, it is possible to optimally suppress degradation of a secondary battery while ensuring a necessary capacity.

BRIEF DESCRIPTION OF DRAWINGS

FIG. 5 is a flowchart illustrating a flow of processing of expanding a use range of an SOC of a cell by a management unit according to the exemplary embodiment.

DESCRIPTION OF EMBODIMENT

Figure 1:
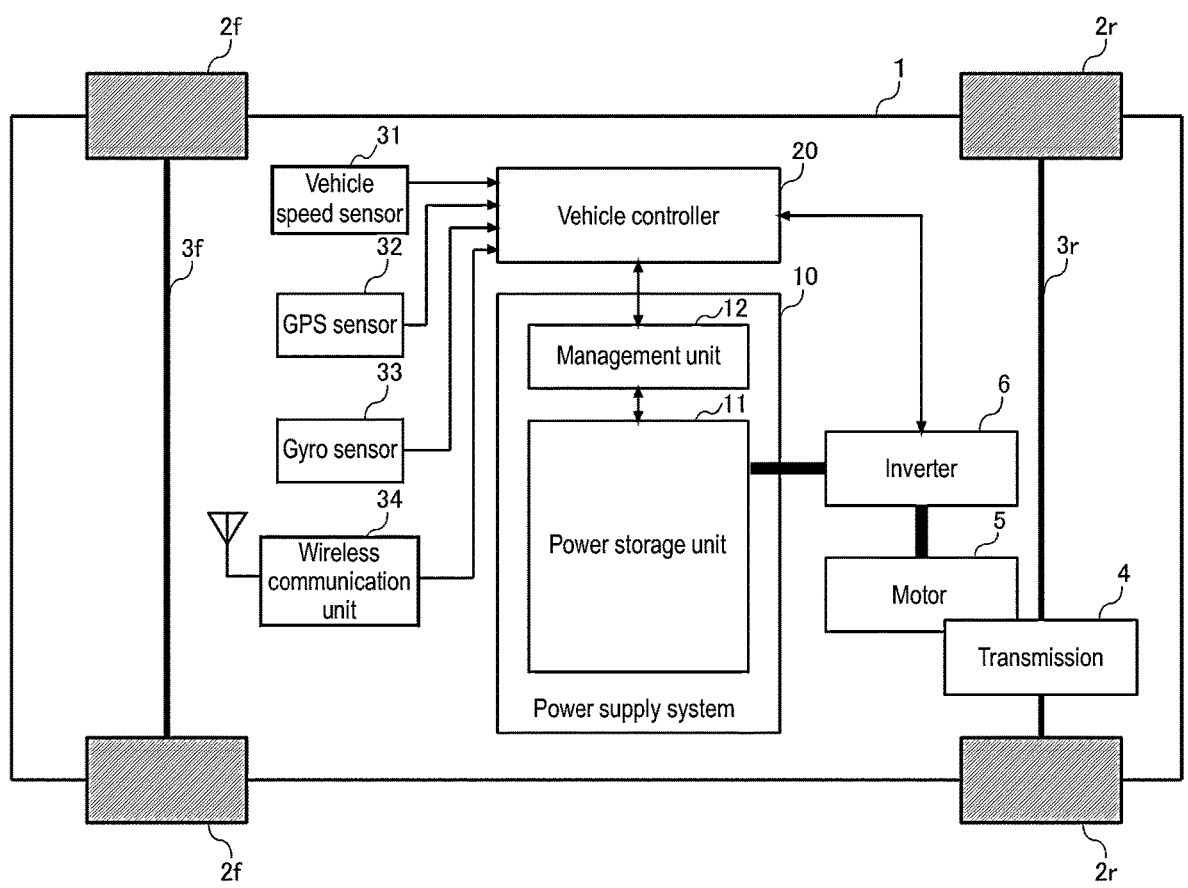
FIG. 1 is a diagram showing a schematic configuration of an electric vehicle according to an exemplary embodiment.

FIG. 1 is a diagram showing a schematic configuration of electric vehicle 1 according to an exemplary embodiment. Electric vehicle 1 shown in FIG. 1 is a rear-wheel drive (2WD) electric vehicle (EV) including a pair of front wheels 2f, a pair of rear wheels 2r, and motor 5 as a power source. The pair of front wheels 2f are connected by front wheel shaft 3f, and the pair of rear wheels 2r are connected by rear wheel shaft 3r. Transmission 4 transmits rotation of motor 5 to rear wheel shaft 3r at a predetermined conversion ratio.

Vehicle controller 20 is a vehicle electronic control unit (ECU) that controls entire electric vehicle 1, and may be configured by, for example, an integrated vehicle control module (VCM).

Various pieces of detection information indicating a state of electric vehicle 1 are input to vehicle controller 20 from various sensors in electric vehicle 1. As various sensors, in FIG. 1, vehicle speed sensor 31, global positioning system (GPS) sensor 32, and gyro sensor 33 are provided.

Vehicle speed sensor 31 generates a pulse signal proportional to rotation speed of front wheel shaft 3f or rear wheel shaft 3r, and transmits the generated pulse signal to vehicle controller 20. Vehicle controller 20 detects a speed of electric vehicle 1 based on the pulse signal received from vehicle speed sensor 31.

GPS sensor 32 detects position information of electric vehicle 1 and transmits the detected position information to vehicle controller 20. Specifically, GPS sensor 32 respectively receives, from a plurality of GPS satellites, radio waves including their respective transmission times, and calculates the latitude and longitude of the reception point based on the plurality of transmission times respectively included in the plurality of received radio waves.

Gyro sensor 33 detects an angular velocity of electric vehicle 1 and transmits the detected angular velocity to vehicle controller 20. Vehicle controller 20 can detect an inclination angle of electric vehicle 1 by integrating the angular velocity received from gyro sensor 33.

Wireless communication unit 34 performs wireless communication with various servers on the Internet, roadside units, other vehicles, etc. As wireless communication networks, for example, a mobile phone network (cellular network), a wireless local area network (LAN), ETC (Electronic Toll Collection System), DSRC (Dedicated Short Range Communications), V2I (Vehicle-to-Infrastructure), and V2V (Vehicle-to-Vehicle)) can be used.

Figure 2:
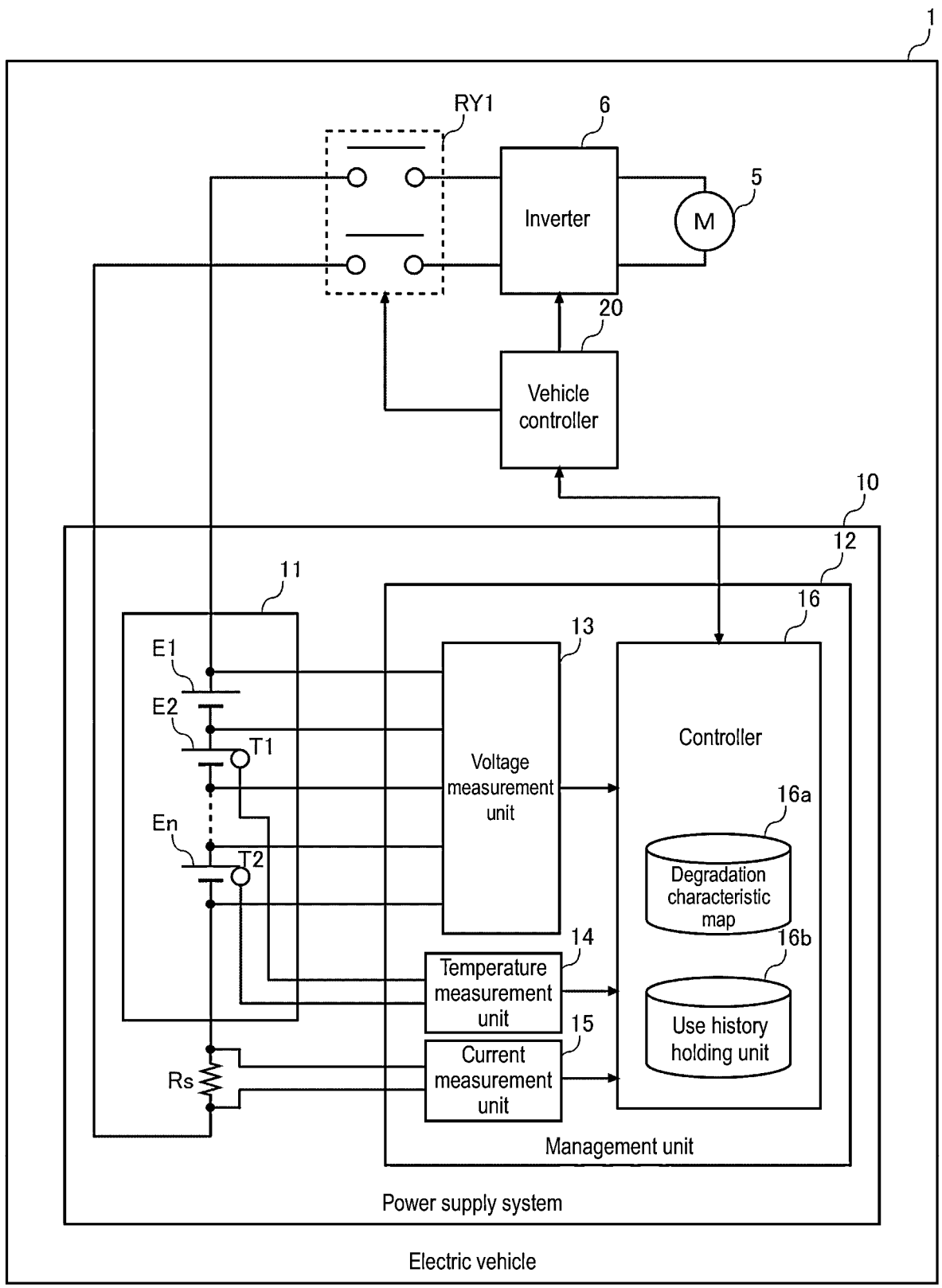
FIG. 2 is a diagram for explaining a detailed configuration of a power supply system for the electric vehicle shown in FIG. 1.

FIG. 2 is a diagram for explaining a detailed configuration of power supply system 10 of electric vehicle 1 shown in FIG. 1. Power supply system 10 is connected to motor 5 via relay RY1 and inverter 6. During power running, inverter 6 converts DC power supplied from power supply system 10 into AC power and supplies the AC power to motor 5. At the time of regeneration, the AC power supplied from motor 5 is converted into DC power and the DC power is supplied to power supply system 10. Motor 5 is a three-phase AC motor, and rotates in accordance with the AC power supplied from inverter 6 during power running. At the time of regeneration, the rotational energy due to deceleration is converted into AC power and supplied to inverter 6.

Relay RY1 is a contactor inserted between wirings connecting power supply system 10 and inverter 6. Vehicle controller 20 controls relay RY1 to an on state (closed state) during traveling, and electrically connects power supply system 10 and a power system of electric vehicle 1. When the vehicle is not running, vehicle controller 20 controls relay RY1 to an off state (open state) in principle, and electrically shuts off power supply system 10 and the power system of electric vehicle 1. Instead of the relay, another type of switch such as a semiconductor switch may be used.

Power supply system 10 includes battery module 11 and management unit 12, and battery module 11 includes a plurality of cells E1 to En connected in series. For each of the cells, a lithium-ion battery cell, a nickel hydrogen battery cell, a lead battery cell, or the like can be used. Hereinafter, an example using lithium-ion battery cells (nominal voltage: from 3.6 V to 3.7 V) is assumed in this description. A number of cells E1 to En connected in series is determined depending on a drive voltage of motor 5.

Shunt resistor Rs is connected in series with the plurality of cells E1 to En. Shunt resistor Rs functions as a current detection element. A Hall element may be used instead of shunt resistor Rs. Battery module 11 has a plurality of temperature sensors T1, T2 installed therein for detecting temperatures of the plurality of cells E1 to En. One temperature sensor may be installed for each of the power storage modules, or one temperature sensor may be installed for each of the plurality of cells. For example, a thermistor can be used for each of temperature sensors T1, T2.

Management unit 12 includes voltage measurement unit 13, temperature measurement unit 14, current measurement unit 15, and controller 16. Respective nodes of the plurality of cells E1 to En connected in series are connected to voltage measurement unit 13 with a plurality of voltage lines. Voltage measurement unit 13 measures a voltage of each of cells E1 to En by measuring a voltage between two adjacent voltage lines. Voltage measurement unit 13 transmits the measured voltage of each of cells E1 to En to controller 16.

Voltage measurement unit 13 has a higher voltage than controller 16, so that voltage measurement unit 13 and controller 16 are connected with a communication line in an insulated state. Voltage measurement unit 13 can include an application specific integrated circuit (ASIC) or a general-purpose analog front-end integrated circuit (IC). Voltage measurement unit 13 includes a multiplexer and an A/D converter. The multiplexer outputs the voltage between two adjacent voltage lines to the A/D converter in order from the top. The A/D converter converts an analog voltage input from the multiplexer into a digital value.

Temperature measurement unit 14 includes a voltage dividing resistor and an A/D converter. The A/D converter sequentially converts a plurality of analog voltages divided by the plurality of temperature sensors T1, T2 and a plurality of voltage dividing resistors into digital values and outputs them to controller 16. Controller 16 estimates temperatures of the plurality of cells E1 to En based on the digital values. For example, controller 16 estimates a temperature of each of cells E1 to En based on a value measured by the temperature sensor closest to the corresponding one of cells E1 to En.

Current measurement unit 15 includes a differential amplifier and an A/D converter. The differential amplifier amplifies the voltage across shunt resistor Rs, and outputs the amplified voltage to the A/D converter. The A/D converter converts an analog voltage input from the differential amplifier into a digital value, and outputs the digital value to controller 16. Controller 16 estimates currents flowing through the plurality of cells E1 to En based on the digital values.

When an A/D converter is mounted in controller 16 and an analog input port is installed in controller 16, temperature measurement unit 14 and current measurement unit 15 may output analog voltages to controller 16, and the A/D converter in controller 16 may convert the analog voltages into digital values.

Controller 16 manages states of the plurality of cells E1 to En based on the voltages, temperatures, and currents of the plurality of cells E1 to En measured by voltage measurement unit 13, temperature measurement unit 14, and current measurement unit 15, respectively. Controller 16 and vehicle controller 20 are connected by an in-vehicle network. For example, a controller area network (CAN) or a local interconnect network (LIN) can be used as the in-vehicle network.

Controller 16 estimates the SOC and a state of health (SOH) of each of the plurality of cells E1 to En. Controller 16 estimates the SOC by combining an open circuit voltage (OCV) method and a current integration method. The OCV method is a method of estimating the SOC based on the OCV of each of cells E1 to En measured by voltage measurement unit 13 and the SOC-OCV curve. The current integration method is a method of estimating the SOC based on the OCV at the start of charging and discharging of each of cells E1 to En and an integrated value of a current measured by current measurement unit 15. In the current integration method, a measurement error of current measurement unit 15 accumulates as charging and discharging time increases. Thus, the SOC estimated by the current integration method needs to be corrected using the SOC estimated by the OCV method.

The SOH is defined by a ratio of a current full charge capacity (FCC) to an initial FCC1, and a lower numerical value (closer to 0%) indicates that degradation progresses. The SOH may be acquired by measuring capacity by complete charge and discharge, or may be acquired by adding storage degradation and cycle degradation.

The SOH can also be estimated based on a correlation with internal resistance of a cell. The internal resistance can be estimated by dividing a voltage drop caused by allowing a predetermined current to flow through a cell for a predetermined time by the current value. The internal resistance decreases as the temperature rises, and increases as the SOH decreases.

Controller 16 can be configured by a microcomputer and a nonvolatile memory (for example, an electrically erasable programmable read-only memory (EEPROM) and a flash memory). Degradation characteristic map 16a and use history holding unit 16b are constructed in the nonvolatile memory. Degradation characteristic map 16a includes a charge cycle degradation characteristic map, a discharge cycle degradation map, and a storage degradation characteristic map.

Note that some functions of controller 16 may be executed on a cloud server. For example, degradation characteristic map 16a and use history holding unit 16b may be constructed in a cloud server. The cloud server is connected to controller 16 of electric vehicle 1 by wireless communication, and collects the use history of cells E1 to En from controller 16. In addition, the cloud server feeds back calculation results for various types of control to controller 16.

The cycle degradation is degradation that progresses with increase in a number of times of charge and discharge. The cycle degradation mainly occurs due to cracking or peeling by expansion or contraction of the active material. The cycle degradation depends on an SOC range to be used, a temperature, and a current rate. In general, the cycle degradation rate increases as the SOC range to be used is wider, as the temperature is higher, and as the current rate is higher.

The storage degradation is degradation that progresses over time depending on the temperature of a secondary battery at each time point and the SOC at each time point. The storage degradation progresses with time regardless of whether or not the charge or discharge is being performed. The storage degradation mainly occurs due to formation of a coating (solid electrolyte interphase (SEI) film) on the negative electrode. The storage degradation depends on the SOC and the temperature at each time point. When the SOC at each time point is higher or when the temperature at each time point is higher, the storage degradation progresses more rapidly.

The cycle degradation rate and the storage degradation rate are derived in advance for each secondary battery product by an experiment or simulation by a battery manufacturer.

Figure 3:
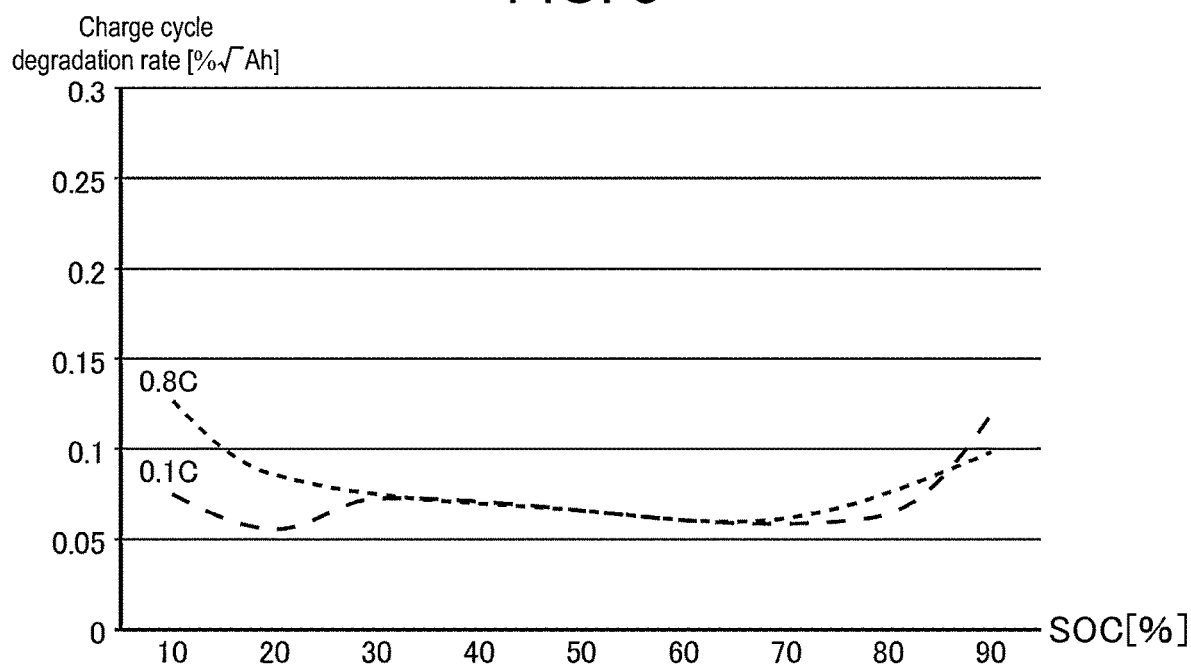
FIGS. 3(a) and 3(b) is diagram showing an example of a cycle degradation characteristic map.
Figure 3:
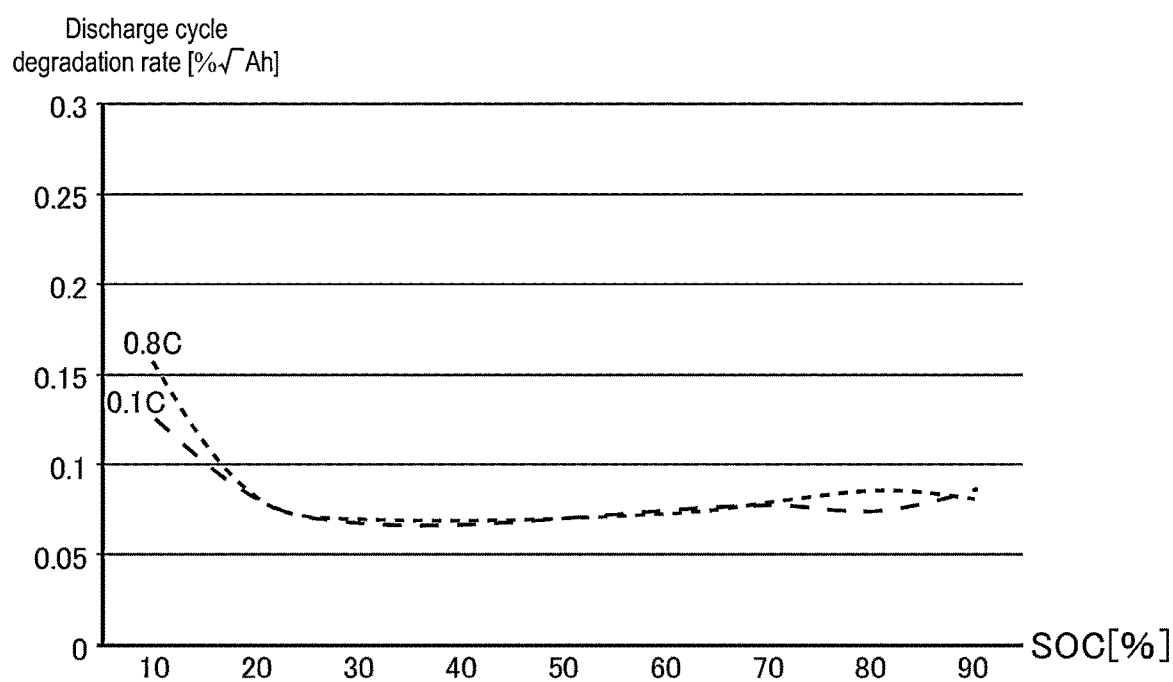

FIGS. 3(a) and 3(b) is diagram showing an example of a cycle degradation characteristic map. FIG. 3(a) shows an example of a charge cycle degradation characteristic map, and FIG. 3(b) shows an example of a discharge cycle degradation characteristic map. The horizontal axis indicates the use range of SOC [%]. In FIGS. 3(a) and 3(b), the value of each SOC indicates the lower limit value of the 10% use range. For example, SOC 10% indicates charging and discharging in a range of SOC 10% to 20%, and SOC 11% indicates charging and discharging in a range of SOC 11% to 21%. The vertical axis represents the cycle degradation rate [% $\sqrt{Ah}$]. The cycle degradation is known to progress with the 0.5 power law (square root) in ampere hour (Ah).

In FIGS. 3(a) and 3(b), for the sake of simplicity, only cycle degradation characteristics for two types of current rates of 0.1 C and 0.8 C are illustrated, but actually, cycle degradation characteristics for a large number of current rates are generated. During charging, as shown in FIG. 3(a), it can be seen that the cycle degradation rate increases in a region where the use range of the SOC is low and a region where the use range of the SOC is high. During discharging, as shown in FIG. 3(b), it can be seen that the cycle degradation rate increases in a region where the use range of the SOC is low.

In addition, the cycle degradation characteristic does not contribute as much as the current rate, but are also affected by temperature. Therefore, in order to increase the estimation accuracy of the cycle degradation rate, it is preferable to prepare a cycle degradation characteristic that defines the relationship between the SOC use range and the cycle degradation rate for each two-dimensional combination of a plurality of current rates and a plurality of temperatures. On the other hand, when a simple cycle degradation characteristic map is generated, the temperature is regarded as normal temperature, and cycle degradation characteristic for each of a plurality of current rates need only be prepared.

The cycle degradation characteristic may be defined by a cycle degradation characteristic model (function) in which the SOC use range, the current rate, and the temperature are used as explanatory variables and the cycle degradation rate is used as an objective variable, instead of the map. Note that the temperature may be a constant.

Figure 4:
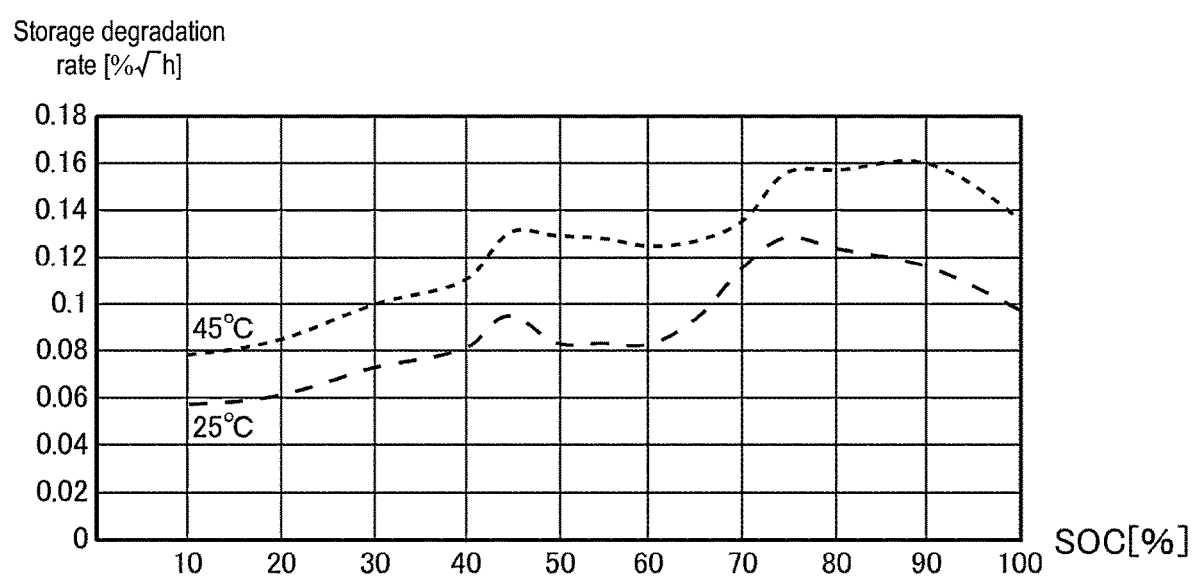
FIG. 4 is a diagram showing an example of a storage degradation characteristic map.

FIG. 4 is a diagram showing an example of a storage degradation characteristic map. The horizontal axis represents SOC [%], and the vertical axis represents storage degradation rate [% $\sqrt{h}$]. It is known that storage degradation progresses according to the 0.5 power law (square root) of time h (hour).

In FIG. 4, for the sake of simplicity, only the storage degradation characteristics for two types of temperatures of 25° C. and 45° C. are illustrated, but actually, storage degradation characteristics for a large number of temperatures are generated. The storage degradation characteristic may be defined by a storage degradation characteristic model (function) in which the SOC and the temperature are used as explanatory variables and the storage degradation rate is used as an objective variable, instead of the map.

The description returns to FIG. 2. Use history holding unit 16b accumulates use histories of cells E1 to En. For example, the current flowing through each of cells E1 to En and the temperature of each of cells E1 to En are recorded in a histogram. The current is preferably divided into charge and discharge to generate a histogram. The voltage or SOC history of each of cells E1 to En may be accumulated.

In addition, controller 16 holds the set value of the use range of the SOC of the cell in a nonvolatile memory (for example, EEPROM). The use range of the SOC is defined by a lower limit value and an upper limit value (SOC_1, SOC_h) of the use range. At the time of shipment, for example, (20, 80) is set.

Since the capacity of the cell decreases as the cell is degraded, the travelable distance of electric vehicle 1 decreases as the cell is degraded. When electric vehicle 1 is a business vehicle (for example, a delivery vehicle, a taxi), it is necessary to charge battery module 11 with a capacity for ensuring a travel distance necessary for daily business before starting business. When the chargeable capacity of battery module 11 is less than the capacity corresponding to the required travel distance, it is necessary to expand the use range of the SOC to increase the chargeable capacity of battery module 11.

FIG. 5 is a flowchart illustrating a flow of processing of expanding the use range of the SOC of the cell by management unit 12 according to the exemplary embodiment. Controller 16 acquires the lower limit value and the upper limit value (SOC_1, SOC_h) of the SOC use range of the cell from the non-volatile memory. Further, controller 16 acquires a value ($\Delta$SOC) of the SOC whose use range needs to be expanded (S10). The SOC value ($\Delta$SOC) to be expanded can be calculated by dividing the capacity that needs to be added by the current full charge capacity (FCC). The current full charge capacity (FCC) can be calculated by multiplying the initial full charge capacity (FCC) by the degradation degree (SOH).

In the example of the business vehicle described above, the capacity that needs to be added is a difference (shortage) between the capacity for ensuring the travel distance necessary for daily business and the capacity that can be supplied in the use range of the current SOC. In the case of a private car, the capacity that needs to be added can be set to an arbitrary value. For example, a process of adding a preset value may be performed after several years (for example, after 2 years) from the use of battery module 11.

Controller 16 acquires the representative discharge current and the representative charge current from the use history of the cell in use history holding unit 16b (S11). Controller 16 sets the median of the current section having the highest frequency of use as the representative discharge current from the histogram of the discharge current of the cell, and sets the median of the current section having the highest frequency of use as the representative charge current from the histogram of the charge current of the cell. How to determine the representative discharge current and the representative charge current is not limited to this method. For example, the representative discharge current may be calculated by performing weighted averaging (time during which the discharge current flows is a coefficient) of a plurality of history values of the discharge current, or a median of the plurality of history values of the discharge current may be set as the representative discharge current. The same applies to the representative charge current.

Controller 16 acquires the discharge cycle degradation characteristic at the current rate corresponding to the acquired representative discharge current from degradation characteristic map 16a. Controller 16 calculates increase $\Delta D1d$ of the discharge cycle degradation rate when the lower limit value (SOC_1) is decreased by a unit step (SOC_step) based on the acquired discharge cycle degradation characteristic and the lower limit value (SOC_1) of the current SOC use range (S12). In the present exemplary embodiment, an example in which the unit step (SOC_step) is set to SOC1% is assumed. Note that, the width of the unit step (SOC_step) is not limited to 1%. For example, it may be 0.5% or 2%. The unit step may be fixed or variable.

Controller 16 acquires the charge cycle degradation characteristic of the current rate corresponding to the acquired representative charge current from degradation characteristic map 16a. Controller 16 calculates increase $\Delta D1c$ of the charge cycle degradation rate when the lower limit value (SOC_1) is decreased by the unit step (SOC_step) based on the acquired charge cycle degradation characteristic and the lower limit value (SOC_1) of the current SOC use range (S13).

Controller 16 calculates increase $\Delta D2d$ of the discharge cycle degradation rate when the upper limit value (SOC_h) is increased by the unit step (SOC_step) based on the acquired discharge cycle degradation characteristic and the upper limit value (SOC_h) of the current SOC use range (S14).

Controller 16 calculates increase $\Delta D2c$ of the charge cycle degradation rate when the upper limit value (SOC_h) is increased by the unit step (SOC_step) based on the acquired charge cycle degradation characteristic and the upper limit value (SOC_h) of the current SOC use range (S15).

Controller 16 adds increase $\Delta D1d$ in the discharge cycle degradation rate and increase $\Delta D1c$ in the charge cycle degradation rate when the calculated lower limit value (SOC_1) is lowered to calculate increase $\Delta D1$ in the degradation rate when the lower limit value (SOC_1) is lowered. Controller 16 adds increase $\Delta D2d$ in the discharge cycle degradation rate and increase $\Delta D2c$ in the charge cycle degradation rate when the calculated upper limit value (SOC_h) is increased to calculate increase $\Delta D2$ in the degradation rate when the upper limit value (SOC_h) is increased (S16).

Controller 16 compares increase $\Delta D1$ in the degradation rate when the calculated lower limit value (SOC_1) is lowered with increase $\Delta D2$ in the degradation rate when the upper limit value (SOC_h) is increased (S17). When the former ($\Delta D1$) is less than or equal to the latter ($\Delta D2$) (Y in S17), controller 16 subtracts the unit step (SOC_step) from the current lower limit value (SOC_1) to generate a new lower limit value (SOC_1) (S18). When the former ($\Delta D1$) exceeds the latter ($\Delta D2$) (N in S17), controller 16 adds the unit step (SOC_step) to the current upper limit value (SOC_h) to generate a new upper limit value (SOC_h) (S19).

Controller 16 determines whether or not the value of the SOC to be expanded ($\Delta$SOC) has reached 0 (S20). When the SOC value has not reached 0 (N in S20), controller 16 subtracts the unit step (SOC_step) from the current SOC value to be expanded ($\Delta$SOC) to generate a new SOC value to be expanded ($\Delta$SOC) (S21). Thereafter, the process shifts to step S12, and the processes after step S12 are repeatedly executed.

When the value of the SOC to be expanded ($\Delta$SOC) has reached 0 (Y in S20), controller 16 overwrites and stores the lower limit value and the upper limit value (SOC_1, SOC_h) of the updated SOC use range as a new lower limit value and upper limit value (SOC_1, SOC_h) in the nonvolatile memory (S22).

The above processing is performed for each cell, and the lower limit value and the upper limit value (SOC_1, SOC_h) of the SOC use range of each cell are set.

In step S11 of the flowchart shown in FIG. 5, controller 16 has acquired the representative discharge current and the representative charge current from the use history of the cell in use history holding unit 16b. In this regard, controller 16 may acquire the representative temperature at the time of discharge and the representative temperature at the time of charge in addition to the representative discharge current and the representative charge current from the use history of the cell in use history holding unit 16b. Controller 16 sets the median of the temperature section having the highest occurrence frequency from the histogram of the temperature at the time of discharge of the cell as the representative temperature at the time of discharge, and sets the median of the temperature section having the highest occurrence frequency from the histogram of the temperature at the time of charge of the cell as the representative temperature at the time of charge. Note that, the method of determining the representative temperature at the time of discharge and the representative temperature at the time of charge is not limited to this method. For example, a plurality of history values of the temperature at the time of discharge may be weight averaged (discharge time at each temperature is a coefficient) to calculate the representative temperature at the time of discharge, or a median of the plurality of history values of the temperature at the time of discharge may be set to the representative temperature at the time of discharge. The same applies to the representative temperature at the time of charge.

In step S12, controller 16 acquires the discharge cycle degradation characteristic corresponding to the combination of the current rate corresponding to the acquired representative discharge current and the representative temperature at the time of discharge from degradation characteristic map 16a. In step S13, controller 16 acquires the charge cycle degradation characteristic corresponding to the combination of the current rate corresponding to the acquired representative charge current and the representative temperature at the time of charge from degradation characteristic map 16a.

In steps S12 to S14 of the flowchart shown in FIG. 5, increase $\Delta D1d$ in the discharge cycle degradation rate and increase $\Delta D1c$ in the charge cycle degradation rate when the lower limit value (SOC_l) is decreased by the unit step (SOC_step), and increase $\Delta D2d$ in the discharge cycle degradation rate and increase $\Delta D2c$ in the charge cycle degradation rate when the upper limit value (SOC_h) is increased by the unit step (SOC_step) are calculated. In this regard, increase $\Delta D1s$ in the storage degradation rate when the lower limit value (SOC_l) is decreased by the unit step (SOC_step) and increase $\Delta D2s$ in the storage degradation rate when the upper limit value (SOC_h) is increased by the unit step (SOC_step) may be additionally calculated.

In this case, controller 16 acquires the storage degradation characteristic corresponding to the representative temperature from degradation characteristic map 16a. As the representative temperature, a representative temperature of the entire use period of the cell is used. Controller 16 calculates increase $\Delta D1s$ in the storage degradation rate when the lower limit value (SOC_l) is decreased by the unit step (SOC_step) based on the acquired storage degradation characteristic and the lower limit value (SOC_l) of the current SOC use range. Similarly, controller 16 calculates increase $\Delta D2s$ in the storage degradation rate when the upper limit value (SOC_h) is increased by the unit step (SOC_step) based on the acquired storage degradation characteristic and the upper limit value (SOC_h) of the current SOC use range.

In step S16, controller 16 adds increase $\Delta D1s$ in the storage degradation rate, increase $\Delta D1d$ in the discharge cycle degradation rate, and increase $\Delta D1c$ in the charge cycle degradation rate when the calculated lower limit value (SOC_l) is decreased to calculate increase $\Delta D1$ in the degradation rate when the lower limit value (SOC_l) is decreased. Controller 16 adds increase $\Delta D2s$ in the storage degradation rate, increase $\Delta D2d$ in the discharge cycle degradation rate, and increase $\Delta D2c$ in the charge cycle degradation rate when the calculated upper limit value (SOC_h) is increased to calculate increase $\Delta D2$ in the degradation rate when the upper limit value (SOC_h) is increased.

The degree of contribution of increase $\Delta D1s$, $\Delta D2s$ in the storage degradation rate may be adjusted by multiplying increase $\Delta D1s$, $\Delta D2s$ in the storage degradation rate by a coefficient. For example, when the charge/discharge period per day is short, a coefficient larger than 1 may be multiplied to increase the degree of contribution of increase $\Delta D1s$, $\Delta D2s$ in the storage degradation rate.

As described above, according to the present exemplary embodiment, when the use range of the SOC is expanded, the use range is expanded by a unit step toward a side causing smaller degradation, by decreasing the lower limit value or increasing the upper limit value. As a result, it is possible to maximize a degradation suppressing effect of the secondary battery while achieving necessary traveling performance of electric vehicle 1. In the case of a vehicle for business use, it is possible to maximize the degradation suppressing effect of the secondary battery while ensuring a necessary travel distance. The control described in PTLs 1 and 2 does not selectively extend the use range of the SOC toward the side causing smaller degradation when expanding the use range of the SOC, and it cannot be said that the degradation suppression of the secondary battery is optimized.

The present disclosure is described above according to the exemplary embodiment. It will be understood by a person of ordinary skill in the art that the exemplary embodiment is merely an example, other modified examples in which configuration elements and processing processes of the exemplary embodiment are variously combined are possible, and the other modifications still fall within the scope of the present disclosure.

In the exemplary embodiment described above, increase $\Delta D1$ in the degradation rate when the lower limit value (SOC_l) is decreased is calculated from the sum of increase $\Delta D1d$ in the discharge cycle degradation rate and increase $\Delta D1c$ in the charge cycle degradation rate, or the sum of increase $\Delta D1s$ in the storage degradation rate, increase $\Delta D1d$ in the discharge cycle degradation rate, and increase $\Delta D1c$ in the charge cycle degradation rate. In this regard, increase $\Delta D1$ in the degradation rate when the lower limit value (SOC_l) is decreased may be specified only by increase $\Delta D1s$ in the storage degradation rate. Similarly, increase $\Delta D2$ in the degradation rate when the upper limit value (SOC_h) is increased may be specified only by increase $\Delta D2s$ in the storage degradation rate.

Note that the exemplary embodiment may be specified by the following items.

[Item 1]

Management device (12) including:
  measurement unit (15, 14) that measures at least one of a current and a temperature of secondary battery (E1);
  holding unit (16b) that accumulates a value measured by measurement unit (15, 14) as a use history of secondary battery (E1); and
  controller (16) that, when expanding a use range of a state of charge (SOC) of secondary battery (E1), increases an upper limit value or decreases a lower limit value of the use range of the SOC to expand the use range of the SOC, wherein controller (16) determines increasing an upper limit value or decreasing a lower limit value of the use range of the SOC to a side causing a smaller increase in a degradation rate of secondary battery (E1), based on at least one of a cycle degradation characteristic defining a cycle degradation rate in accordance with a use range of the SOC and a current rate of secondary battery (E1) and a storage degradation characteristic defining a storage degradation rate in accordance with an SOC and a temperature of secondary battery (E1), and a typical use condition of secondary battery (E1) based on a use history of secondary battery (E1).

According to this, it is possible to expand the use range of the SOC of secondary battery (E1) while optimally suppressing the degradation of secondary battery (E).

[Item 2]

Management device (12) according to item 1, wherein controller (16):

respectively derives increases in a cycle degradation rate during charging when an upper limit value of a use range of the SOC is increased and when a lower limit value of the use range of the SOC is decreased, based on a charge cycle degradation characteristic defining a cycle degradation rate during charging in accordance with a use range of the SOC of secondary battery (E1) and a current rate of a charge current and a typical charge current of secondary battery (E1) based on a use history of secondary battery (E1);

respectively derives increases in a cycle degradation rate during discharging when an upper limit value of a use range of the SOC is increased and when a lower limit value of the use range of the SOC is decreased based on a discharge cycle degradation characteristic defining a cycle degradation rate during discharging in accordance with a use range of the SOC of secondary battery (E1) and a current rate of a discharge current and a typical discharge current of secondary battery (E1) based on a use history of secondary battery (E1); and determines increasing an upper limit value or decreasing a lower limit value of the use range of the SOC to a side providing a smaller sum of an increase in a cycle degradation rate during the charging and an increase in a cycle degradation rate during the discharging.

According to this, it is possible to expand the use range of the SOC of secondary battery (E1) while optimally suppressing the cycle degradation of secondary battery (E).

[Item 3]

Management device (12) according to item 1, wherein controller (16):

respectively derives increases in a cycle degradation rate during charging when an upper limit value of a use range of the SOC is increased and when a lower limit value of the use range of the SOC is decreased, based on a charge cycle degradation characteristic defining a cycle degradation rate during charging in accordance with a use range of the SOC of secondary battery (E1) and a current rate of a charge current and a typical charge current of secondary battery (E1) based on a use history of secondary battery (E1);

respectively derives increases in a cycle degradation rate during discharging when an upper limit value of a use range of the SOC is increased and when a lower limit value of the use range of the SOC is decreased based on a discharge cycle degradation characteristic defining a cycle degradation rate during discharging in accordance with a use range of the SOC of secondary battery (E1) and a current rate of a discharge current and a typical discharge current of secondary battery (E1) based on a use history of secondary battery (E1);

respectively derives increases in a storage degradation rate when an upper limit value of a use range of the SOC is increased and when a lower limit value of the use range of the SOC is decreased based on the storage degradation characteristic and a representative temperature of secondary battery (E1) based on a use history of secondary battery (E1); and determines increasing an upper limit value or decreasing a lower limit value of the use range of the SOC to a side providing a smaller sum of an increase in a cycle degradation rate during the charging, an increase in a cycle degradation rate during the discharging, and an increase in the storage degradation rate.

This makes it possible to expand the use range of the SOC of secondary battery (E1) while optimally suppressing cycle degradation and storage degradation of secondary battery (E).

[Item 4]

Management device (12) according to any one of items 1 to 3, wherein controller (16) changes an upper limit value or a lower limit value of the use range of the SOC by a predetermined step width, and when an increase in the use range of the SOC of secondary battery (E1) reaches a target value, ends the change of the upper limit value or the lower limit value of the use range of the SOC.

According to this, degradation due to expansion of the use range of the SOC can be minimized by fine control.

[Item 5]

Power supply system (10) for vehicles, power supply system (10) including:

secondary battery (E1) mounted on electric vehicle (1); and management device (12) according to any one of items 1 to 4 that manages secondary battery (E1).

According to this, it is possible to achieve electric vehicle (3) capable of expanding the use range of the SOC of secondary battery (E1) while optimally suppressing the degradation of secondary battery (E).

REFERENCE MARKS IN THE DRAWINGS

1: electric vehicle
2f: front wheel
2r: rear wheel
3f: front wheel shaft
3r: rear wheel shaft
4: transmission
5: motor
6: inverter
10: power supply system
11: battery module
12: management unit
13: voltage measurement unit
14: temperature measurement unit
15: current measurement unit
16: controller
16a: degradation characteristic map
16b: use history holding unit
E1-En: cell
Rs: shunt resistor
T1, T2: temperature sensor
20: vehicle controller
31: vehicle speed sensor
32: GPS sensor
33: gyro sensor
34: wireless communication unit
RY1: relay

The invention claimed is:

1. A management device comprising:
a measurement unit that measures a value of at least one of a current and a temperature of a secondary battery;
a holding unit that accumulates the value measured by the measurement unit as a use history of the secondary battery; and
a controller that, when expanding a use range of a state of charge (SOC) of the secondary battery, increases an upper limit value or decreases a lower limit value of the use range of the SOC to expand the use range of the SOC, wherein
the controller selects one of increase of the upper limit value and decrease of the lower limit value, the one of the increase of the upper limit value and the decrease of the lower limit value causing a smaller increase in a degradation rate of the secondary battery than the other of the increase of the upper limit value and the decrease of the lower limit value, the selecting being made based on (i) a typical use condition of the secondary battery based on the use history of the secondary battery and at least one of (ii-1) a cycle degradation characteristic defining a cycle degradation rate in accordance with the use range of the SOC and a current rate of the secondary battery and (ii-2) a storage degradation characteristic defining a storage degradation rate in accordance with the SOC and a temperature of the secondary battery.

2. The management device according to claim 1, wherein the controller:
estimating an increase in the cycle degradation rate in the cycle degradation rate during charging to the secondary battery, for each of a case where the upper limit value is increased and a case where the lower limit value is decreased based on a charge cycle degradation characteristic defining a cycle degradation rate during the charging in accordance with the use range of the SOC of the secondary battery and a current rate of a charge current and a typical charge current of the secondary battery based on the use history of the secondary battery;
estimating an increase in the cycle degradation rate during discharging from the secondary battery, for each of a case where the upper limit value is increased and a case where the lower limit value is decreased based on a discharge cycle degradation characteristic defining a cycle degradation rate during the discharging in accordance with the use range of the SOC of the secondary battery and a current rate of a discharge current and a typical discharge current of the secondary battery based on the use history of the secondary battery; and
selecting one of increase of the upper limit value and decrease of the lower limit value, the one of the increase of the upper limit value and the decrease of the lower limit value causing a smaller sum of the increase in the cycle degradation rate during the charging and the increase in the cycle degradation rate during the discharging than the other of the increase of the upper limit value and the decrease of the lower limit value.

3. The management device according to claim 1, wherein the controller:
estimating an increase in the cycle degradation rate during charging to the secondary battery, for each of a case where the upper limit value is increased and a case where the lower limit value is decreased based on a charge cycle degradation characteristic defining a cycle degradation rate during the charging in accordance with the use range of the SOC of the secondary battery and a current rate of a charge current and a typical charge current of the secondary battery based on the use history of the secondary battery;
estimating an increase in the cycle degradation rate during discharging from the secondary battery, for each of a case where the upper limit value is increased and a case where the lower limit value is decreased based on a discharge cycle degradation characteristic defining a cycle degradation rate during the discharging in accordance with the use range of the SOC of the secondary battery and a current rate of a discharge current and a typical discharge current of the secondary battery based on the use history of the secondary battery; and
estimating an increase in a storage degradation rate, for each of a case where the upper limit value is increased and a case where the lower limit value is decrease based on the storage degradation characteristic and a representative temperature of the secondary battery based on the use history of the secondary battery; and
selecting one of increase of the upper limit value and decrease of the lower limit value, the one of the increase of the upper limit value and the decrease of the lower limit value causing a smaller sum of the increase in the cycle degradation rate during the charging, the increase in the cycle degradation rate during the discharging, and the increase in the storage degradation rate than the other of the increase of the upper limit value and the decrease of the lower limit value.

4. The management device according to claim 1, wherein the controller changes the upper limit value or the lower limit value by a predetermined step width, and when an increase in the use range of the SOC of the secondary battery reaches a target value, ends the change of the upper limit value or the lower limit value of the use range of the SOC.

5. A power supply system for vehicles, the power supply system comprising:
a secondary battery mounted on an electric vehicle; and
the management device according to claim 1 that manages the secondary battery.

* * * * *